(12) United States Patent
Bandyopadhyay et al.

(10) Patent No.: US 11,916,707 B2
(45) Date of Patent: Feb. 27, 2024

(54) POWER EFFICIENCY IN AN ANALOG FEEDBACK CLASS D MODULATOR

(71) Applicant: Analog Devices International Unlimited Company, Limerick (IE)

(72) Inventors: Abhishek Bandyopadhyay, Winchester, MA (US); Atsushi Matamura, Tokyo (JP)

(73) Assignee: Analog Devices International Unlimited Company, Limerick (IE)

( * ) Notice: Subject to any disclaimer, the term of this patent is extended or adjusted under 35 U.S.C. 154(b) by 47 days.

(21) Appl. No.: 17/701,928

(22) Filed: Mar. 23, 2022

(65) Prior Publication Data

US 2022/0217026 A1 Jul. 7, 2022

Related U.S. Application Data

(63) Continuation of application No. PCT/EP2020/076655, filed on Sep. 24, 2020.

(60) Provisional application No. 62/905,310, filed on Sep. 24, 2019.

(51) Int. Cl.
| | | |
|---|---|---|
| *H04L 27/04* | (2006.01) | |
| *H03M 3/00* | (2006.01) | |
| *H04L 27/01* | (2006.01) | |

(52) U.S. Cl.
CPC .............. *H04L 27/04* (2013.01); *H03M 3/50* (2013.01); *H04L 27/01* (2013.01)

(58) Field of Classification Search
CPC ........... H04L 27/04; H04L 27/01; H03M 3/50
See application file for complete search history.

(56) References Cited

U.S. PATENT DOCUMENTS

| | | | | |
|---|---|---|---|---|
| 7,450,047 | B1 * | 11/2008 | Wu ..................... | H03M 3/412 341/143 |
| 9,184,765 | B1 * | 11/2015 | Wang .................... | H03M 3/322 |
| 11,757,418 | B2 * | 9/2023 | Tu ............................ | H03F 3/04 330/278 |
| 2003/0122692 | A1 | 7/2003 | Roeckner et al. | |
| 2008/0042745 | A1 * | 2/2008 | Kozak .................... | H03F 3/217 330/251 |
| 2008/0062026 | A1 * | 3/2008 | Melanson ............. | H03M 3/412 341/155 |
| 2013/0127531 | A1 * | 5/2013 | Lesso ..................... | H03F 3/217 330/251 |

(Continued)

OTHER PUBLICATIONS

Midya et al., *Digital Correction of PWM Switching Amplifiers*, IEEE Power Electronics Letters, vol. 2, No. 2, Jun. 2004, 5 pages.

(Continued)

*Primary Examiner* — Freshteh N Aghdam
(74) *Attorney, Agent, or Firm* — ArentFox Schiff LLP

(57) ABSTRACT

Systems and methods are provided for architectures for an analog feedback class D modulator that increase the power efficiency of the class D modulator. In particular, systems and methods are provided for an analog feedback class D modulator having a digital feed-forward loop. The digital feed-forward loop allows for removal of signal content from an input to an analog-to-digital converter, such that the ADC processes just noise and/or error. Using the techniques discussed herein, the loop filter is low power as it processes error content but not signal content.

20 Claims, 11 Drawing Sheets

(56) References Cited

U.S. PATENT DOCUMENTS

| | | | |
|---|---|---|---|
| 2015/0222235 A1* | 8/2015 | Swanson | H02M 3/1582 330/251 |
| 2015/0229324 A1* | 8/2015 | Soenen | H03M 3/344 341/143 |
| 2019/0096376 A1* | 3/2019 | Sakata | H03F 3/2175 |

OTHER PUBLICATIONS

Gaalaas et al., *Integrated Stereo ΔΣ Class D Amplifier*, IEEE Journal of Solid-State Circuits, vol. 40, No. 12, Dec. 2005, 10 pages.

* cited by examiner

POWER EFFICIENCY IN AN ANALOG FEEDBACK CLASS D MODULATOR

CROSS REFERENCE TO RELATED APPLICATIONS

This application is related to and claims the benefit of priority under 35 U.S.C. § 119(e) to International Patent Application No. PCT/EP2020/076655 entitled, "Improving Power Efficiency in an Analog Feedback Class D Modulator" filed on Sep. 24, 2020 and U.S. Provisional Patent Application No. 62/905,310 entitled "Improving Power Efficiency in an Analog Feedback Class D Modulator" filed on Sep. 24, 2019, which are hereby incorporated by reference in their entirety.

FIELD OF THE DISCLOSURE

The present invention relates to class D modulators, and, more specifically, analog feedback class D modulators.

BACKGROUND

Class D devices, such as drivers, modulators, converters, and amplifiers, can be used in audio devices such as speakers. In a conventional transistor amplifier, the output stage includes transistors that supply continuous output current. However, in conventional amplifiers, the output stage power dissipation is large. Class D amplifiers, dissipate much less power. Class D amplifiers use switches as amplifying devices. In particular, a class D amplifier output stage switches between the positive and negative power supplies so as to produce a train of voltage pulses. This reduces power dissipation because the output transistors have zero current when not switching, and have a low voltage when they are conducting current. Thus, class D devices have lower power dissipation, produce less heat, save circuit board space and cost, and (in portable systems) extend battery life.

This overview is intended to provide an overview of subject matter of the present patent application. It is not intended to provide an exclusive or exhaustive explanation of the invention. Further limitations and disadvantages of conventional and traditional approaches will become apparent to one of skill in the art, through comparison of such systems with some aspects of the present invention as set forth in the remainder of the present application with reference to the drawings.

SUMMARY

Systems and methods are provided for an analog feedback class D device that increases power efficiency. The class D modulator presented herein includes a digital feed forward loop and an analog feedback loop. The signal content is provided at the output of the feed forward loop. Using the techniques discussed herein, the feedback loop filter is low power as it processes error content but not signal content. In some examples, the input signal, the state of the loop filters, and the output signal are processed and provided as a feedforward signal, such that the feedback loop only processes error content from the signal.

According to one aspect, an architecture for a class D modulator includes a digital input line for receiving a digital input signal, wherein the digital input line is split into first and second parallel lines, a digital-to-analog converter coupled to the first parallel line, configured to receive the digital input signal and convert the digital input signal to an analog input signal, an analog summer configured to subtract an analog feedback signal from the analog input signal and generate an analog summer output, a loop filter configured to receive the analog summer output and produce a filtered analog output, a quantizer configured to quantize the filtered analog output and output a quantized signal, a filter coupled to the second parallel line configured to filter to the digital input signal generating a filtered digital input signal, wherein the filtered digital input signal is fed forward, and a digital summer configured to add the filtered digital input signal to the quantized signal generating a digital modulator output signal. In some examples, the filter is a delay module and configured to add a first delay to the digital input signal.

According to another aspect, an architecture for a class D modulator includes a digital input line for receiving a digital input signal, wherein the digital input line is split into first and second parallel lines, a first digital-to-analog converter (DAC) coupled to the first parallel line, configured to receive the digital input signal and convert the digital input signal to an analog input signal, a first analog summer configured to subtract an analog feedback signal from the analog input signal and generate a first analog summer output, a loop filter configured to receive the first analog summer output and produce a filtered analog output, a signal processing module coupled to the second parallel line configured to receive the digital input signal and a quantized signal and generate a processed signal, a second digital-to-analog converter (DAC) configured to convert the processed signal to an analog processed signal, a second analog summer configured to add the analog processed signal to the filtered analog output, and a quantizer configured to quantize a second summer output and generate the quantized signal.

The drawings show exemplary digital Class D driver circuits and configurations. Variations of these circuits, for example, changing the positions of, adding, or removing certain elements from the circuits are not beyond the scope of the present invention. The illustrated modulators, configurations, and complementary devices are intended to be complementary to the support found in the detailed description.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

For a fuller understanding of the nature and advantages of the present invention, reference is made to the following detailed description of preferred embodiments and in connection with the accompanying drawings, in which.

DETAILED DESCRIPTION

Embodiments herein relate to new architectures for an analog feedback class D modulator that increases the power efficiency of the class D modulator. In particular, systems and methods are provided for an analog feedback class D modulator having a digital feed-forward loop. The digital feed-forward loop allows for removal of signal content from an input to an analog-to-digital converter, such that the ADC processes just noise and/or error. Using the techniques discussed herein, the feedback loop filter is low power as it processes error content but not signal content. Systems and methods are disclosed for a power efficient (low power) analog feedback class D modulator architecture.

The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Other objects, advantages and novel features of the disclosure are set forth in the proceeding in view of the drawings where applicable.

Figure 1:
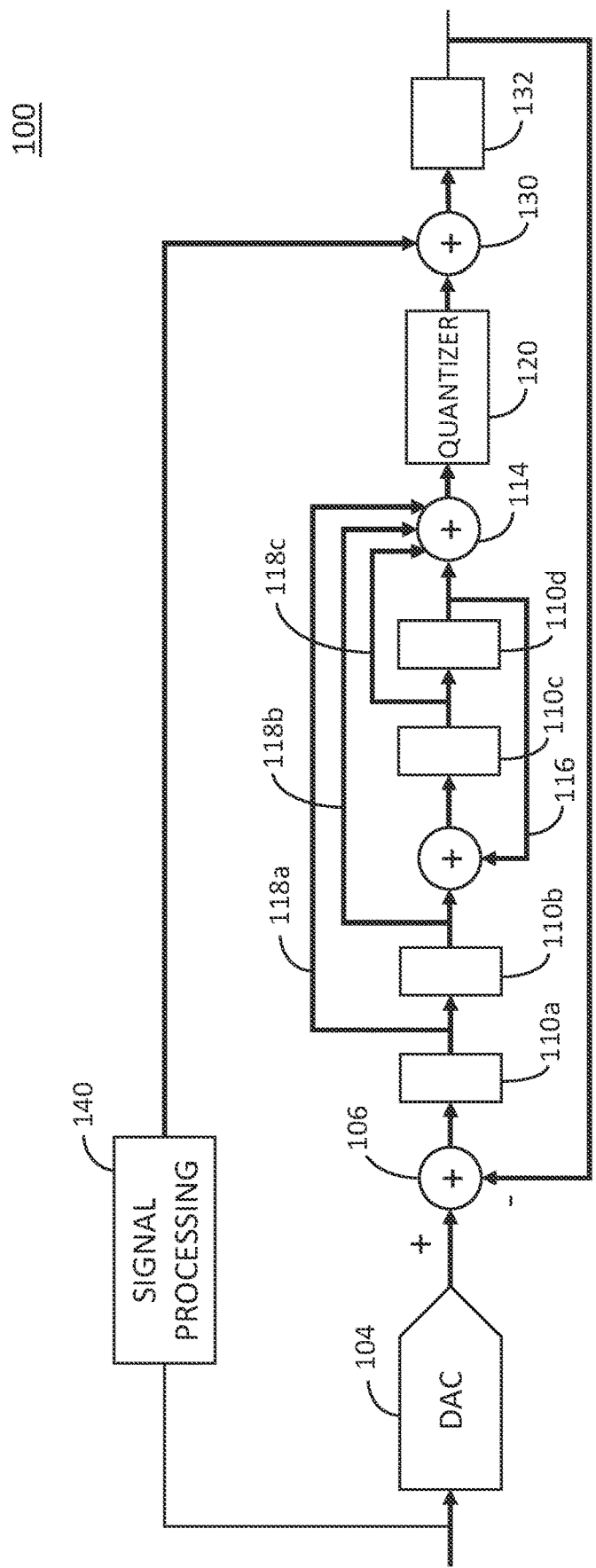
FIG. 1 depicts an example of a class D modulator, in accordance with various embodiments of the disclosure.

FIG. 1 depicts an example analog class D modulator 100. The driver 100 receives a digital signal input 102. The digital input signal is split, with one copy being sent to first line and a second copy sent to a second line. The first line includes the modulator circuit elements, and the second line includes a filter element 140. In the first line, the digital input 102 is input to a digital-to-analog converter (DAC) 104, where the input is converted to an analog input signal. The analog input signal is input to a first summer 106, where a feedback loop signal is subtracted from the analog input signal, such that signal content is removed from the analog input signal, and an error signal is output from the first summer 106. The output from the first summer 106 is then processed by a loop filter 108. The loop filter 108 includes first 110*a*, second 110*b*, third 110*c*, and fourth 110*d* integrators, and second 112 and third 114 summers. The loop filter 108 output is input to a quantizer 120.

As shown in FIG. 1, the loop filter 108 includes a feedback loop 116 and three feed-forward loops 118*a*, 118*b*, 118*c*. The loop filter 108 feedback loop 116 is a loop from the output of the fourth integrator 110*d* to second summer 112. The loop filter 108 also includes multiple feedforward loops. A first loop filter feedforward loop 118*a* is a loop from the output of the first integrator 110*a* to the third summer 114. A second loop filter feedforward loop 118*b* is a loop from the output of the second integrator 110*b* to the third summer 114. A third loop filter feedforward loop 118*c* is a loop from the output of the third integrator 110*c* to the third summer 114. The third summer 114 adds the four inputs (one from each integrator 110*a*, 110*b*, 110*c*, 110*d*), and the third summer 114 output is loop filter 108 output, which is input to the quantizer 120. The quantizer 120 quantizes the loop filter 108 output signal and outputs a quantized signal to the fourth summer 120. According to various implementations, the loop filter 108 processes quantization noise.

According to various examples, the loop filter 108 and the quantizer 120 comprise the analog-to-digital converter (ADC), converting an analog signal input to the loop filter 108 to a digital signal output from the quantizer 120. In some examples, the loop filter 108 is a low pass filter. According to various examples, the quantizer 120 is a multi-bit quantizer. Examples of multi-bit quantizers include 4-bit quantizers, 8-bit-quantizers, 16-bit quantizers, and 24-bit quantizers. In some examples, the first quantizer 120 is a single-bit quantizer.

The second line from the digital signal input 102 includes a filter 140. A second copy of the digital signal is input to the filter 140, and the filter digitally filters the digital signal. The filter 140 outputs a filtered digital signal. In some examples, the filter 140 is a delay module, and the delay module adds a delay to the signal. In some examples, the delay added by the delay module equals the delay of the first line between the digital signal input 102 and the fourth summer 130. The delay module outputs a delayed digital signal.

At a fourth summer 130, the delayed digital signal from the second line is added to the quantizer 120 output. The output from the fourth summer 130 is input to a power stage module 132. The output from the power stage module 132 is the analog class D modulator 100 output. The output from the power stage module 132 is also fed back via the feedback line 134 to the first summer 106, where it is subtracted from the analog input signal. According to various examples, the feedback line 134 includes a DAC.

According to various implementations, in the modulator 100, the loop filter 108 processes quantization noise. In contrast, in conventional modulators, the loop filter processes both signal content and error, including quantization noise, and the quantizer processes signal content.

Figure 2:
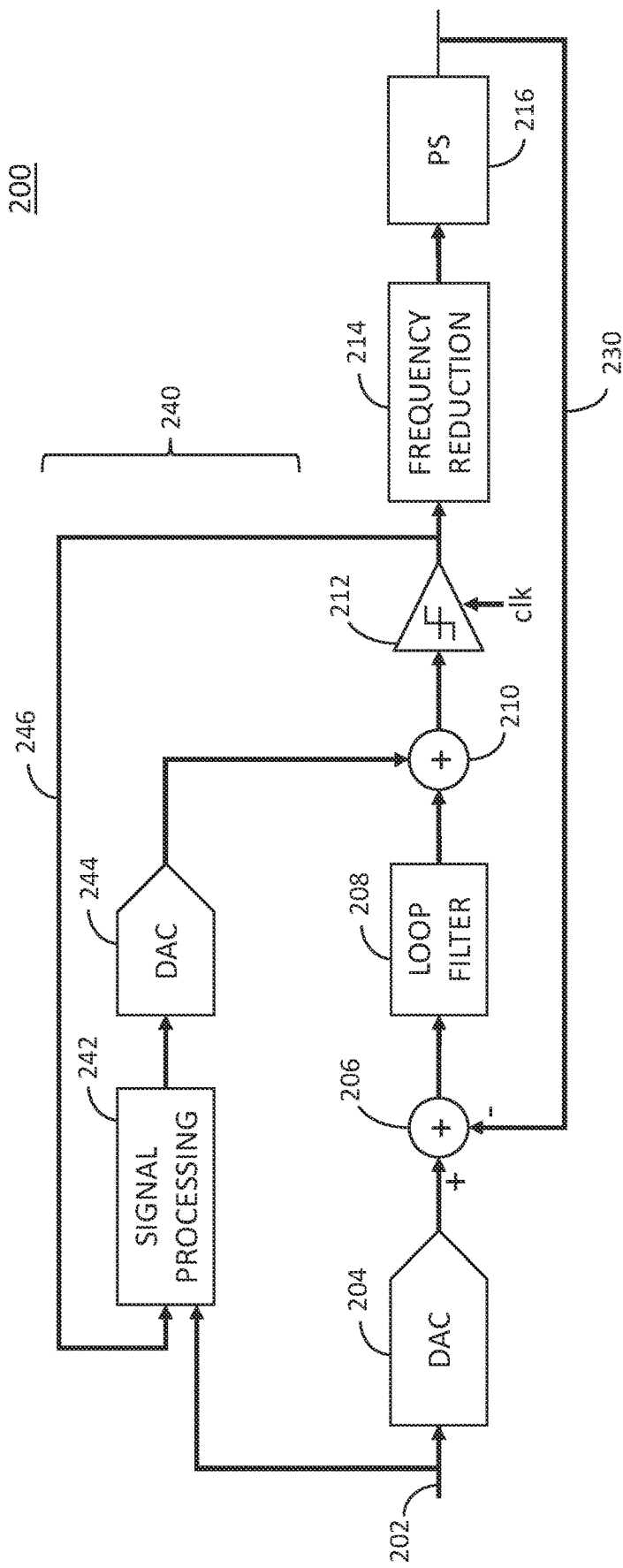
FIG. 2 depicts another example class D modulator, in accordance with various embodiments of the disclosure.

FIG. 2 depicts an example analog class D modulator 200, in accordance with various embodiments of the disclosure. The class D modulator 200 shown in FIG. 2 includes a feedback forward loop 240 having a signal processing module 242 and a DAC 244. According to various examples, a digital input 202 is fed forward through a second multi-bit DAC to the input of the quantizer 212. In particular, the digital input 202 signal is split, with one copy being sent to a first line and a second copy sent to a second line. The first line includes the modulator circuit elements, and the second line includes the feed forward loop 240.

In the first line, the digital input 202 is input to a digital-to-analog converter (DAC) 204, where the input is converted to an analog input signal. In some examples, the DAC 204 is a sigma-delta DAC. The analog input signal is input to a first summer 206, and, at the first summer 206, a feedback loop signal is subtracted from the analog input signal. Thus, signal content is removed from the analog input signal, and the error signal is output from the first summer 206. The output from the first summer 206 is then processed by a loop filter 208. In some examples, the loop filter 208 includes an integrator, and in some examples, the loop filter 208 includes a cascade of integrators. The loop filter 208 output is input to a second summer 210, where it is added to the output from the feed forward loop 240.

The output from the second summer 210 is input to a quantizer 212, which quantizes the summed signal. According to various examples, the quantizer 212 is a multi-bit quantizer. Examples of multi-bit quantizers include 4-bit quantizers, 8-bit-quantizers, 16-bit quantizers, and 24-bit quantizers. In some examples, the quantizer 212 is a single-bit quantizer.

The feed forward loop 240 includes a signal processing module 242 and a digital-to-analog converter (DAC) 244. The digital input signal is input to the signal processing module 242. The signal processing module 242 also receives the output from the quantizer 212 as input on a feedback line 246. Thus, the signal processing module 242 processes both the digital input 204 and the output of the quantizer 212. In some examples, the signal processing module 242 is tunable for switching frequency and performance. In some examples, a reference voltage is adaptively injected to the signal processing module 242. In some examples, the signal processing module 242 changes the reference for the input from the feedback line 246. In one example, the reference is changed for a capacitor that receives the input from the feedback line 246. The signal processing module 242 processes the two digital input signals, and outputs a processed digital signal to the DAC 244. In some examples, the signal processing module 242 controls the reference level and injection of a dynamic hysteresis voltage. In some examples the signal processing module 242 includes a finite state machine. The DAC 244 converts the signal to an analog signal. In various implementations, the DAC 244 is a multi-bit DAC while the DAC 204 is a sigma delta DAC. The DAC 244 analog output is input to the second summer 210, where it is added to the loop filter 208 output.

The output from the quantizer 212 is input to a frequency reduction module 214. The output from the frequency reduction module is input to a power stage 216. The power stage 216 output is the output of the modulator 200. The power stage 216 output is fed back to the first summer 206 via feedback loop 230. At the first summer 206, the power stage 216 output is subtracted from the analog input signal.

Figure 3:
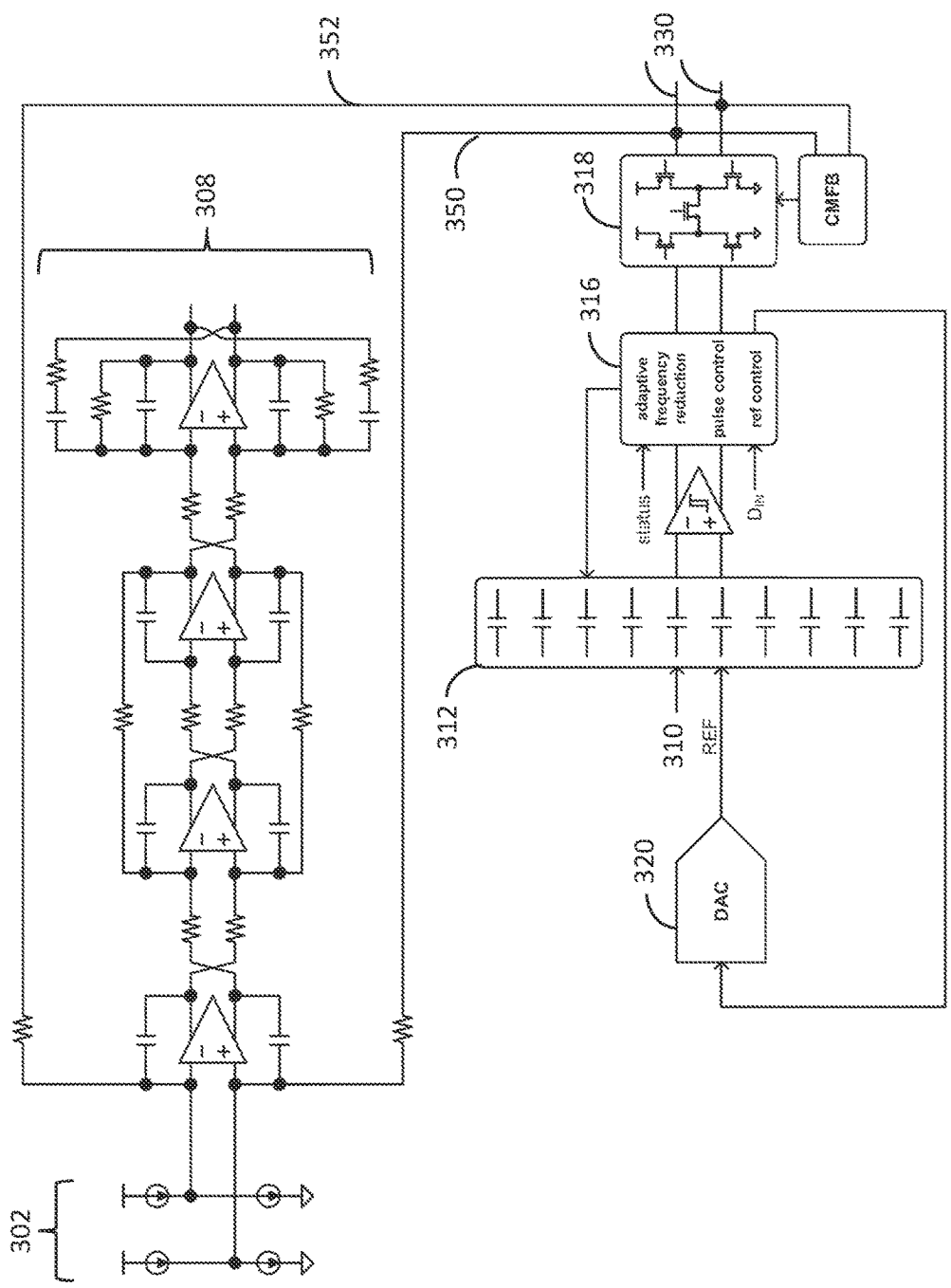
FIG. 3 depicts an example of class D modulator showing circuitry, in accordance with various embodiments of the disclosure.

FIG. 3 depicts an analog feedback class D modulator circuit 300, according to various embodiments of the disclosure. The modulator 300 shown in FIG. 3 shows various circuit components in detail. The modulator 300 includes a digital signal input 302, a loop filter 308, a passive summer 312, a quantizer 314, a frequency reduction module 316, a DAC 320, a power stage 318, a common mode feedback circuit 340, and an output 330. According to various implementations, an output from the loop filter 308 is input to the passive summer 312 via a first input line 310. In some examples, outputs from integrators within the loop filter 308 are fed forward and input to the passive summer 312. The passive summer 312 uses multiple capacitors to perform capacitive summing. In various implementations, the passive summer 312 is replaced with an active summer that includes an operational amplifier.

As shown in FIG. 3, the frequency reduction module 316 has two inputs, including the output from the quantizer 314 and the digital input signal (DIN). In some examples, the frequency reduction module 316 also includes a loop filter status (or internal state) input, as described in greater detail with respect to FIGS. 8-9. The frequency reduction module 316 also includes a reference voltage control and a pulse control. The frequency reduction module 316 is a signal processing module (e.g., signal processing module 242 in FIG. 2). In some examples, the frequency reduction module 316 is a finite state machine. The output from the frequency reduction module 316 is input to the power stage 318. In some examples, the power stage 318 is an H-bridge. The output 330 from the power stage 318 is the modulator circuit 300 output. The output 330 from the power stage 318 is also fed back to the input to the loop filter 308 via lines 350 and 352.

Figure 4:
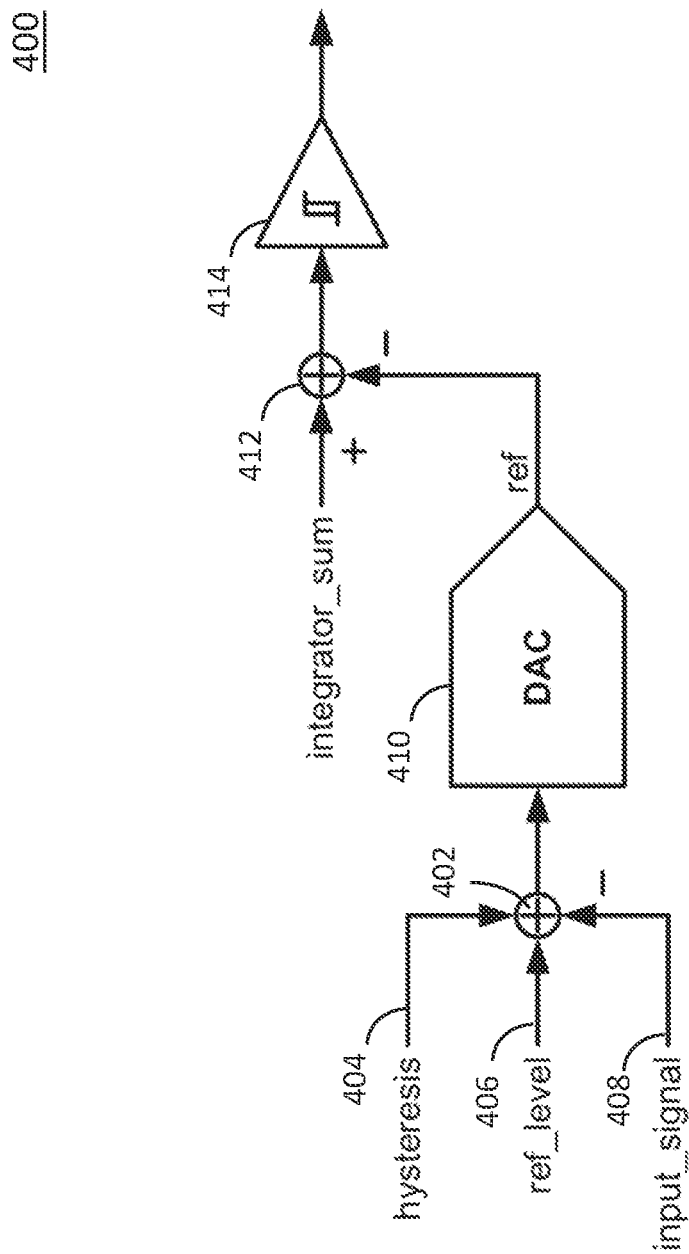
FIG. 4 shows an example of a DAC with passive summing, according to various embodiments of the disclosure.

FIG. 4 is a diagram showing an example of a DAC with passive summing, according to various embodiments of the disclosure. The circuit shown in FIG. 4 includes a first summer 402 having three inputs: a hysteresis input 404, a reference input 406, and an input signal 408. According to some implementations, the first summer 402 and the three inputs comprise a signal processing module, such as the signal processing module 242 of FIG. 2. In some examples, the hysteresis input 404 is determined in a signal processing module, based on an input signal and a feedback signal (e.g., the input signal 202 and the signal on the feedback line 246 in FIG. 2). The hysteresis input 404 is a state dependent dynamic hysteresis from a signal processing module (e.g., signal processing module 242 of FIG. 2), and is used for tuning switching frequency and performance. The first summer 402 adds the hysteresis input 404, the reference input 406, and the input signal 408, and outputs the summed result to the DAC 410. According to some examples, the reference level is changed by the signal level. In one example, the reference level is lowered due to feed-forward signal addition. According to one example, including the hysteresis input 404 helps to reduce switching activity. In general, the hysteresis level is changed by the signal level. In various implementations, the hysteresis level can be tuned with other information, including, for example, one or more of stability state, supply level, and output switching pattern.

The DAC 410 converts the summed digital signal to an analog signal and outputs the analog signal to the second summer 412. The second summer 412 also receives an integrator (or loop filter) output. The second summer subtracts the DAC 410 output from the integrator output, and outputs a second summer 412 signal to a quantizer 414.

Figure 5:
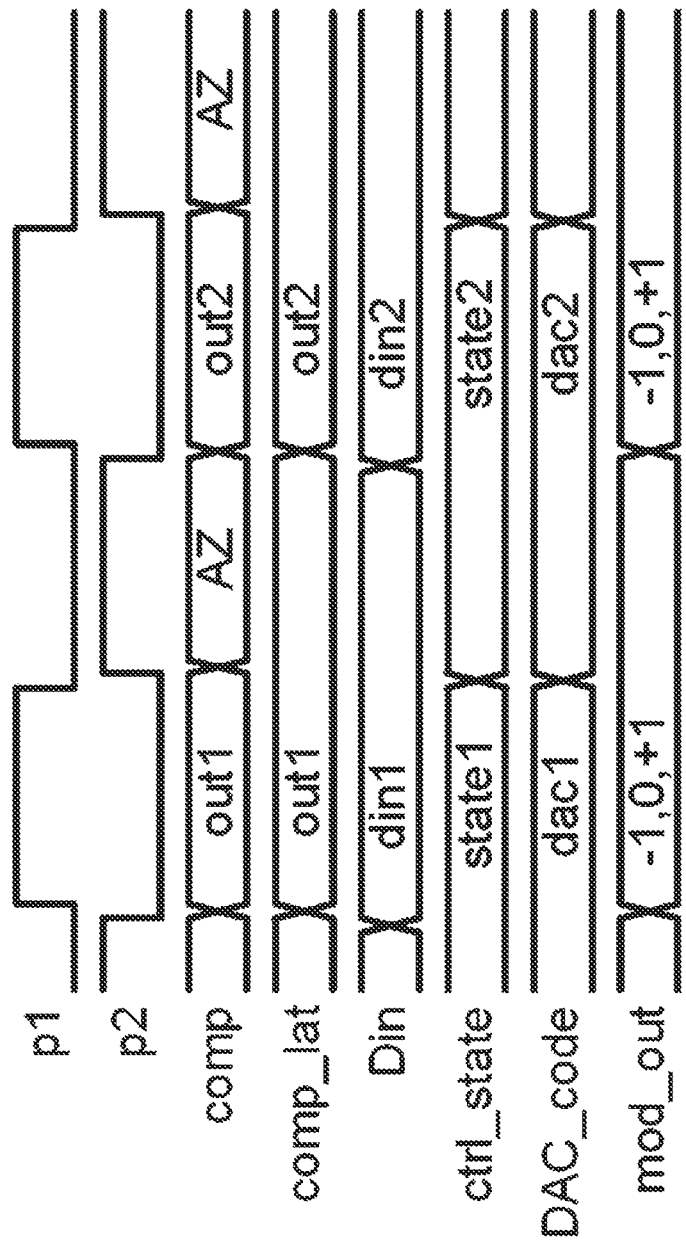
FIG. 5 shows a timing diagram for generating a three-level modulator output, according to various embodiments of the disclosure.

FIG. 5 shows a timing diagram 500 for generating a three-level modulator output, according to various embodiments of the disclosure. In particular, the timing diagram shows inputs p1 and p2, and two comparator outputs. Additionally, loop status information is included in Din. These variables are used to generate control_state and DAC_code results, where control_state is the internal finite state machine and DAC_code is the reference DAC setting. The modulator output is determined based on the variables, and is one of −1, 0, and +1.

Figure 6:
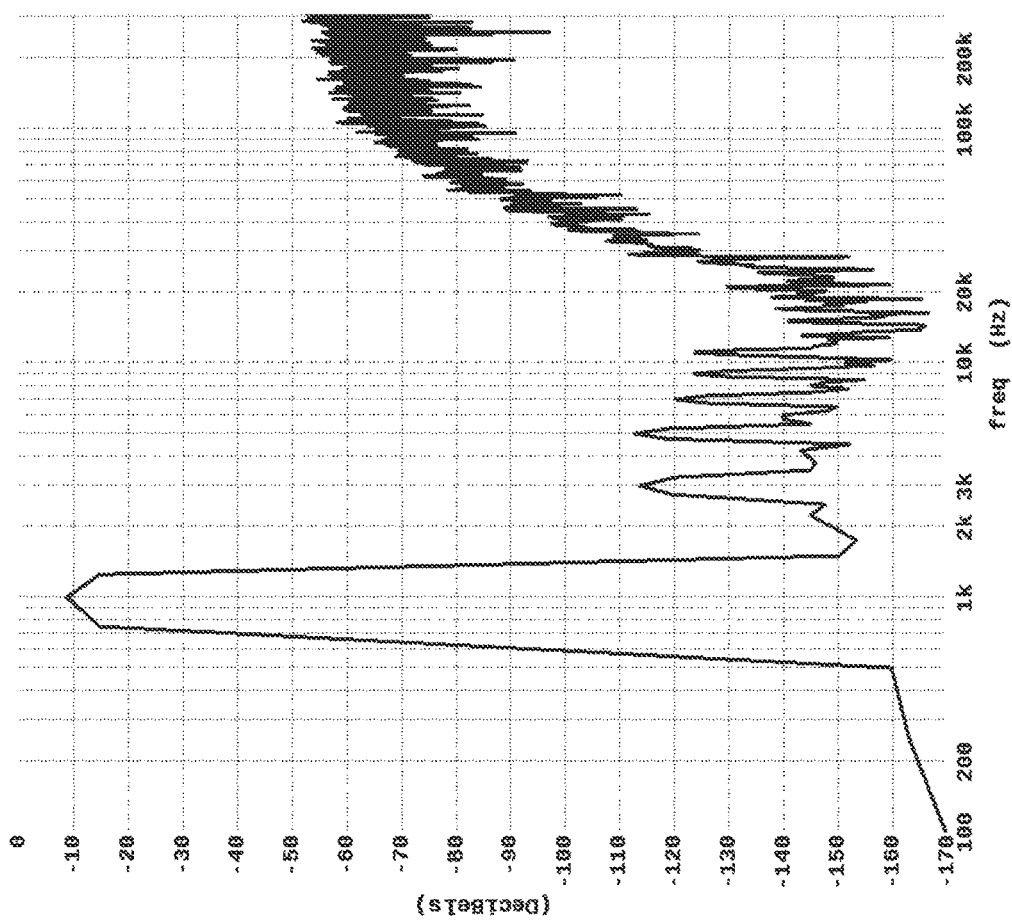
FIG. 6 is a graph showing a Fast Fourier Transform of the modulator output, according to various embodiments of the disclosure.

FIG. 6 is a graph 600 showing a Fast Fourier Transform of the modulator output, according to various embodiments of the disclosure. The FFT shows results of a model using fully primitive integrators and a −2 dBFS.

Figure 7:
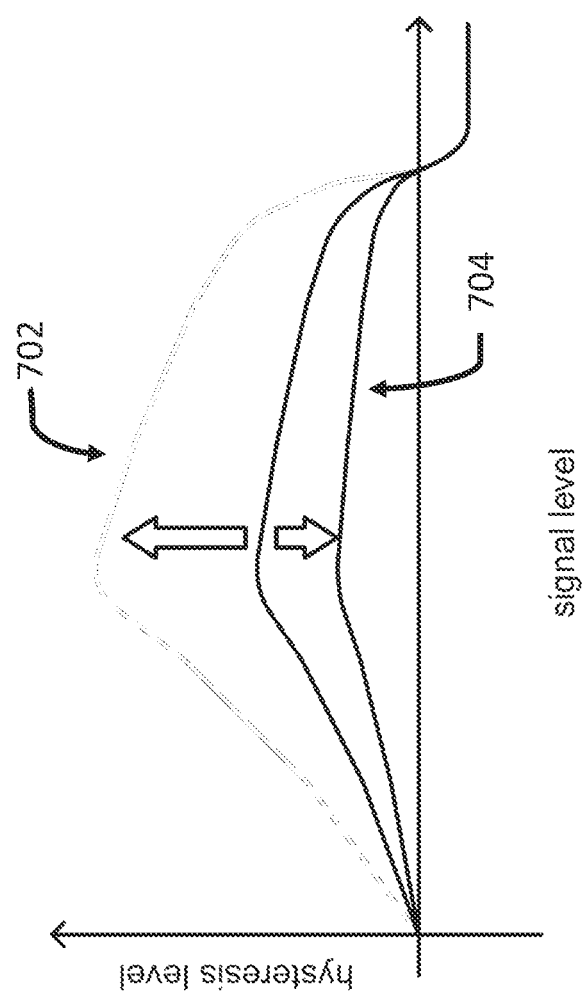
FIG. 7 is a graph showing hysteresis level at various signal levels, according to various embodiments of the disclosure.

FIG. 7 is a graph 700 showing hysteresis level at various signal levels, according to various embodiments of the disclosure. In various examples, hysteresis level is adaptively controlled, and in particular, the signal level controls the hysteresis level. In some examples, the adaptive control is input condition dependent. In some examples, the adaptive control is dependent on intended conditions. In some examples, the adaptive control dependence changes dynamically. In some examples, as shown in the top line 702 of the graph 700, switching frequency is optimized, such that switching frequency is reduced, but there are higher noise levels. In other examples, as shown in the bottom line 704 in the graph 700, noise is optimized such that noise is reduced but there is higher frequency.

According to various implementations, there are different kinds of hysteresis. In some examples, the basis for the hysteresis is input level. In other examples, the basis for the hysteresis is an element of the loop filter, such as a state of the loop filter, state (output) of an integrator in the loop filter, and/or an input. In various examples, the hysteresis level can be optimized.

Figure 8:
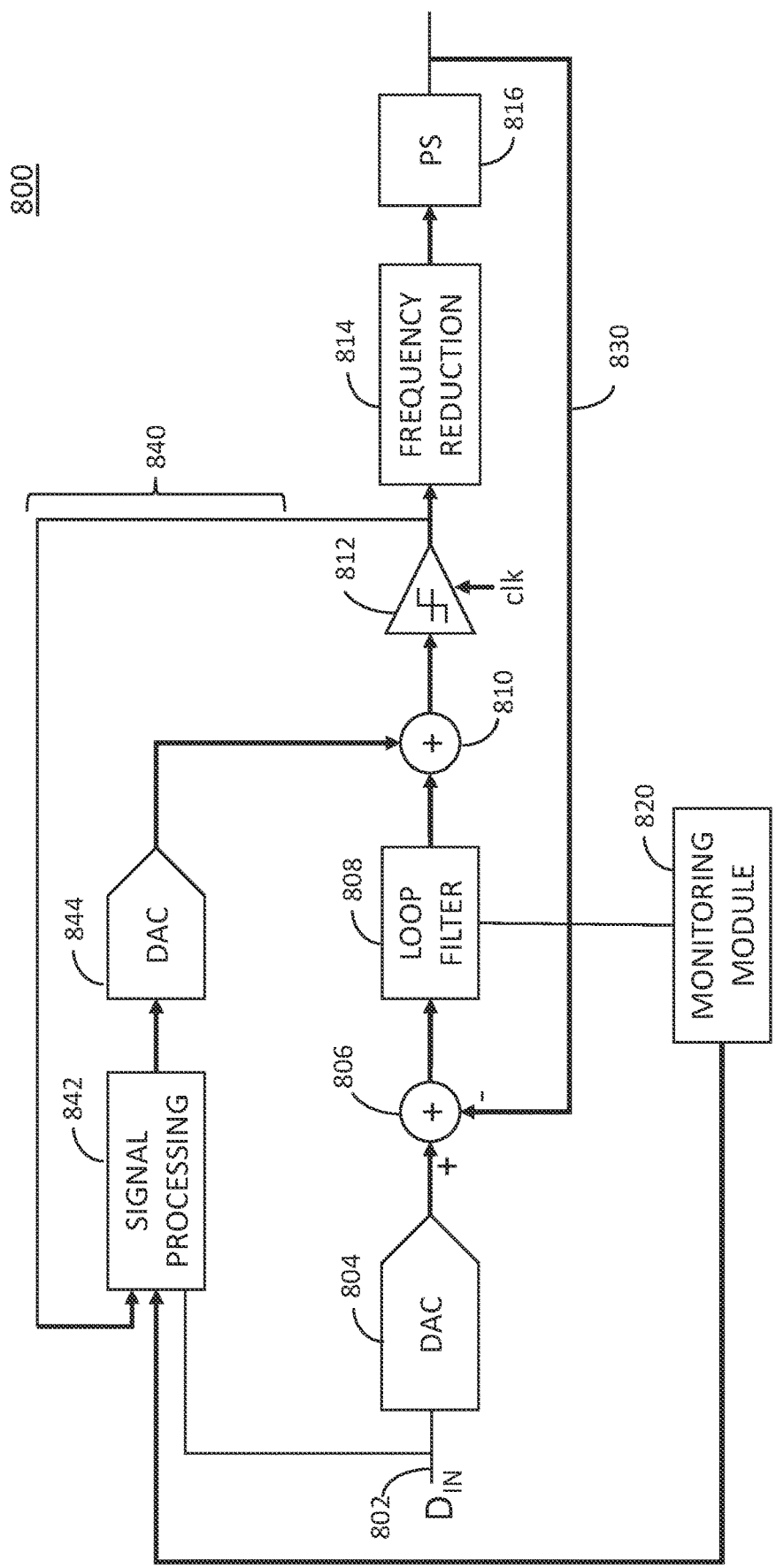
FIG. 8 depicts an example analog class D modulator, in accordance with various embodiments of the disclosure.

FIG. 8 depicts an example analog class D modulator 800, in accordance with various embodiments of the disclosure. The class D modulator 800 shown in FIG. 8 includes a feed forward loop 840 having a signal processing module 842 and a DAC 844. According to various examples, a digital input 802 is fed forward through a second multi-bit DAC to the input of the quantizer 812. In particular, the digital input 802 signal is split, with one copy being sent to a first line and a second copy sent to a second line. The first line includes the modulator circuit elements, and the second line includes the feed forward loop 840.

The class D modulator 800 includes a loop filter monitoring module 820, which monitors an internal state of the loop filter 808. The loop filter monitoring module 820 is connected to the loop filter 808, and the output of the loop filter monitoring module 820 is input to the signal processing module 842. In some examples, the loop filter monitoring module 820 filters information about an internal state of the loop filter 808 and provides loop filter 808 internal state information to the signal processing module 842.

Figure 9:
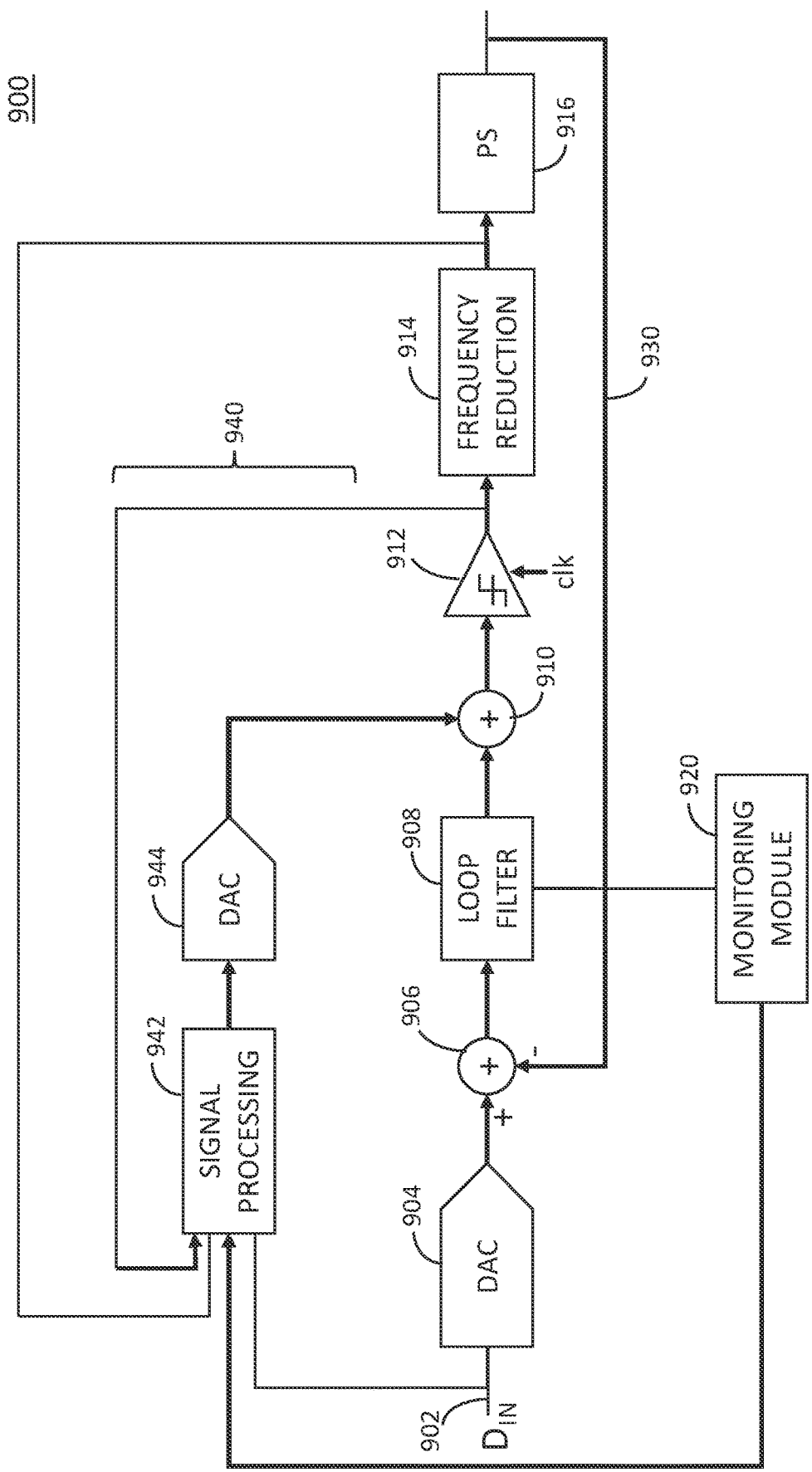
FIG. 9 depicts an example analog class D modulator, in accordance with various embodiments of the disclosure.

FIG. 9 depicts an example analog class D modulator 900, in accordance with various embodiments of the disclosure. The class D modulator 900 shown in FIG. 9 includes a feedback forward loop 940 having a signal processing module 942 and a DAC 944. The feed forward loop 940 receives a feedback signal from the output of the frequency reduction module 914. According to various examples, a digital input 902 is fed forward through a second multi-bit DAC to the input of the quantizer 912. In particular, the digital input 902 signal is split, with one copy being sent to a first line and a second copy sent to a second line. The first line includes the modulator circuit elements, and the second line includes the feed forward loop 940.

The class D modulator 900 includes a loop filter monitoring module 920, which monitors an internal state of the loop filter 908. The loop filter monitoring module 920 is connected to the loop filter 908, and the output of the loop filter monitoring module 920 is input to the signal processing module 942. In some examples, the loop filter monitoring module 920 filters information about an internal state of the loop filter 908 and provides loop filter 908 internal state information to the signal processing module 942. Thus, the signal processing module 942 receives four inputs: the digital input signal, the loop filter feedback signal, the quantizer output signal, and the frequency reduction module output signal.

Figure 10:
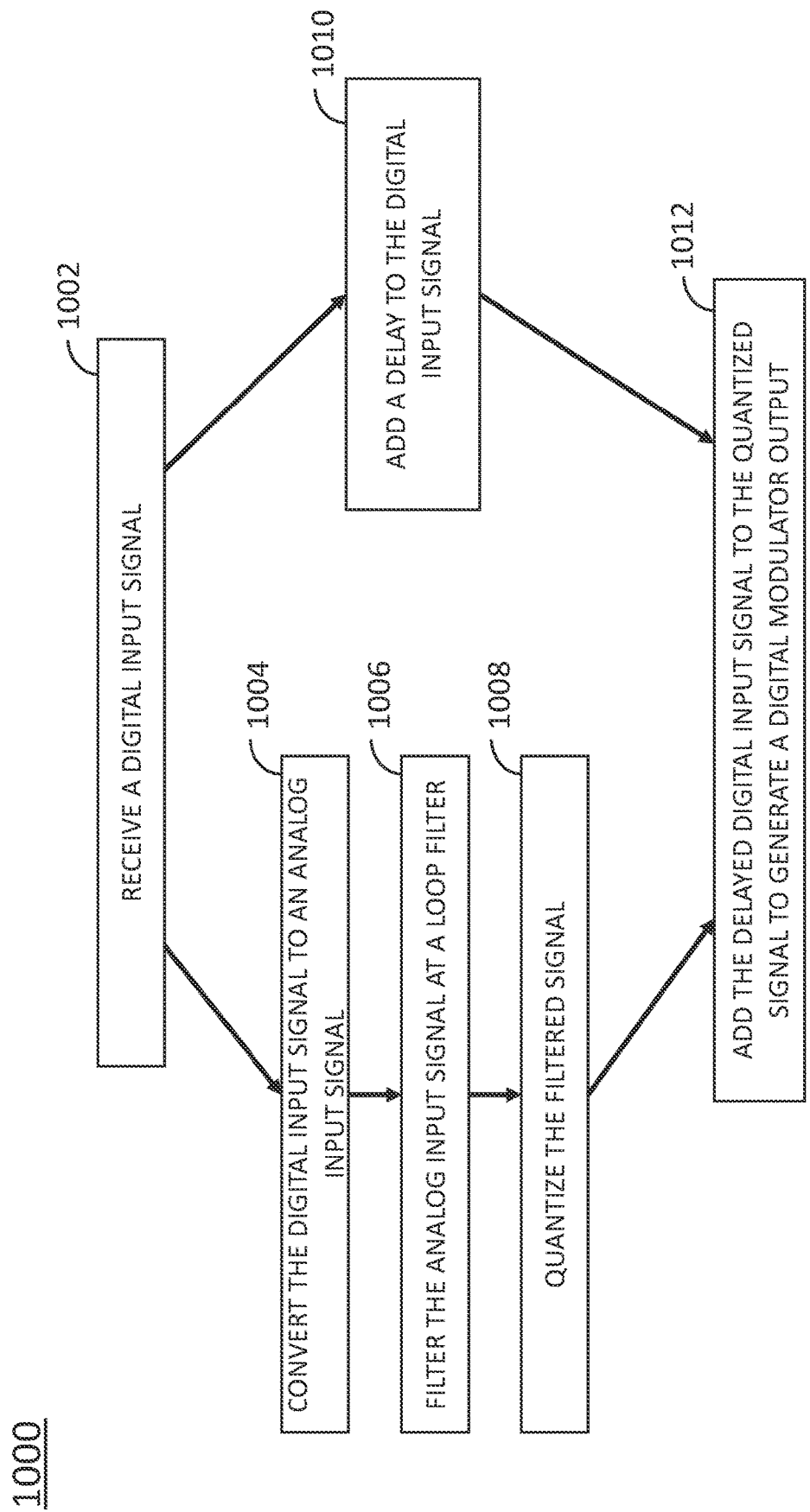
FIG. 10 is a flow chart illustrating a method for an analog feedback class D modulator, according to various embodiments of the disclosure.

FIG. 10 is a flow chart illustrating a method 1000 for an analog feedback class D modulator, according to various embodiments. At step 1002, a digital input signal is received at a first input. The method then proceeds along two parallel paths simultaneously. Along a first path, at step 1004, the digital input signal is converted to an analog input signal at a digital-to-analog converter. In some examples, the DAC is a sigma-delta DAC. At step 1006, the analog input signal is filtered at a loop filter. A loop filter is described above with respect to FIGS. 1-3, for example. At step 1008, the filtered signal is quantized at a quantizer.

Along the second path, at step 1010, a delay is added to the digital input signal. In some examples, the delay is equal to, or about equal to, a delay added by the loop filter in step 1006. At step 1012, the delayed digital input signal is added to the quantized signal to generate a digital modulator output.

Figure 11:
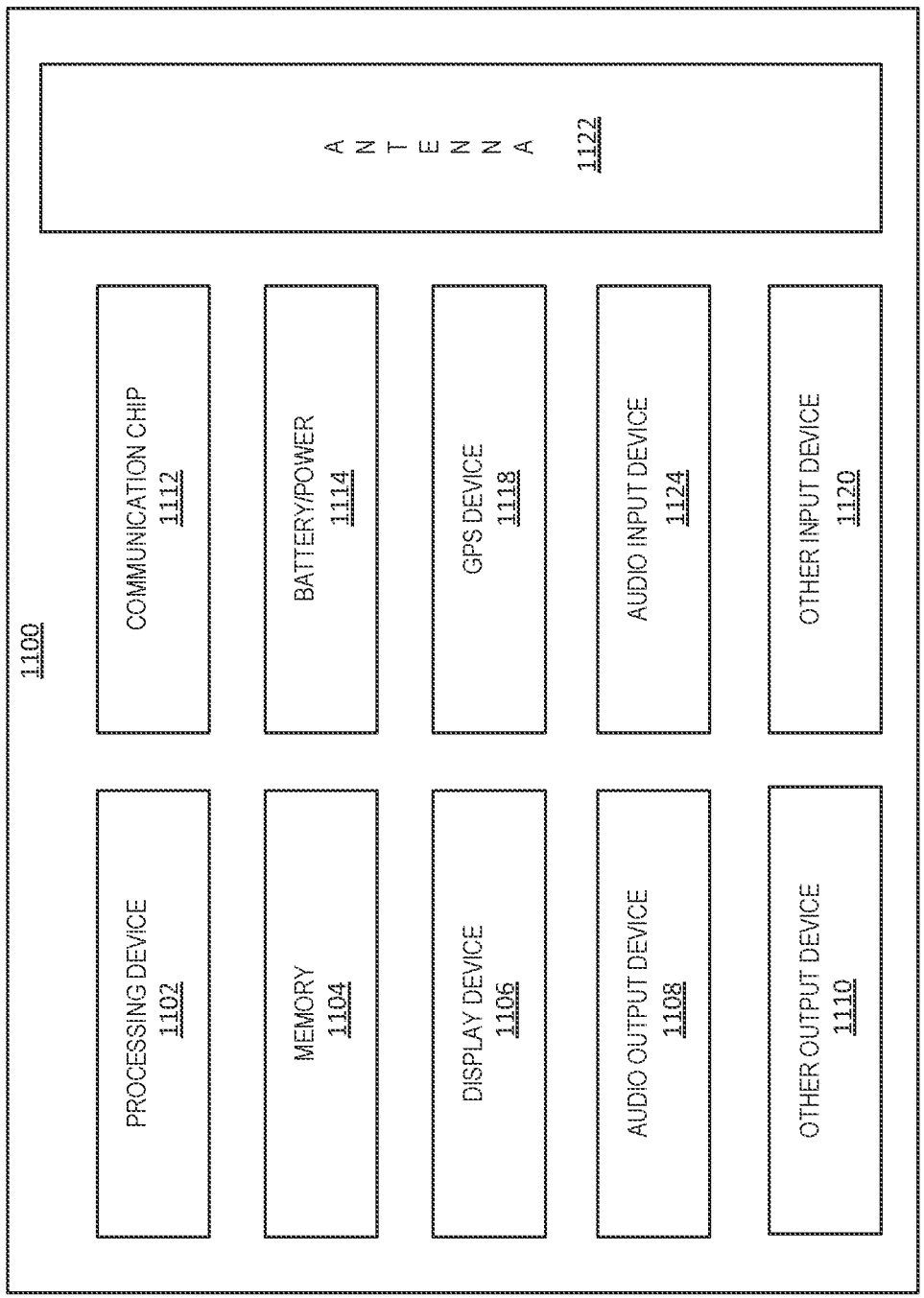
FIG. 11 is a block diagram of an example electrical device that may include one or more class D modulators, in accordance with various embodiments of the disclosure.

FIG. 11 is a block diagram of an example electrical device 1100 that may include one or more digital class D drivers, in accordance with any of the embodiments disclosed herein. A number of components are illustrated in FIG. 11 as included in the electrical device 1100, but any one or more of these components may be omitted or duplicated, as suitable for the application. In some embodiments, some or all of the components included in the electrical device 1100 may be attached to one or more motherboards. In some embodiments, some or all of these components are fabricated onto a single system-on-a-chip (SoC) die.

Additionally, in various embodiments, the electrical device 1100 may not include one or more of the components illustrated in FIG. 11, but the electrical device 1100 may include interface circuitry for coupling to the one or more components. For example, the electrical device 1100 may not include a display device 1106, but may include display device interface circuitry (e.g., a connector and driver circuitry) to which a display device 1106 may be coupled. In another set of examples, the electrical device 1100 may not include an audio input device 1124 or an audio output device 1108, but may include audio input or output device interface circuitry (e.g., connectors and supporting circuitry) to which an audio input device 1124 or audio output device 1108 may be coupled.

The electrical device 1100 may include a processing device 1102 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1102 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1100 may include a memory 1104, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1104 may include memory that shares a die with the processing device 1102. This memory may be used as cache memory and may include embedded dynamic random access memory (eDRAM) or spin transfer torque magnetic random access memory (STT-MRAM).

In some embodiments, the electrical device 1100 may include a communication chip 1112 (e.g., one or more communication chips). For example, the communication chip 1112 may be configured for managing wireless communications for the transfer of data to and from the electrical device 1100. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1112 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1112 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1112 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1112 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1112 may operate in accordance with other wireless protocols in other embodiments. The electrical device 1100 may include an antenna 1122 to facilitate wireless communications and/or to receive other wireless communications (such as AM or FM radio transmissions).

In some embodiments, the communication chip 1112 may manage wired communications, such as electrical, optical, or any other suitable communication protocols (e.g., the Ethernet). As noted above, the communication chip 1112 may include multiple communication chips. For instance, a first communication chip 1112 may be dedicated to shorter-range wireless communications such as Wi-Fi or Bluetooth, and a second communication chip 1112 may be dedicated to longer-range wireless communications such as global positioning system (GPS), EDGE, GPRS, CDMA, WiMAX, LTE, EV-DO, or others. In some embodiments, a first communication chip 1112 may be dedicated to wireless communications, and a second communication chip 1112 may be dedicated to wired communications.

The electrical device 1100 may include battery/power circuitry 1114. The battery/power circuitry 1114 may include one or more energy storage devices (e.g., batteries or capacitors) and/or circuitry for coupling components of the electrical device 1100 to an energy source separate from the electrical device 1100 (e.g., AC line power).

The electrical device 1100 may include a display device 1106 (or corresponding interface circuitry, as discussed above). The display device 1106 may include any visual indicators, such as a heads-up display, a computer monitor, a projector, a touchscreen display, a liquid crystal display (LCD), a light-emitting diode display, or a flat panel display.

The electrical device 1100 may include an audio output device 1108 (or corresponding interface circuitry, as discussed above). The audio output device 1108 may include any device that generates an audible indicator, such as speakers, headsets, or earbuds.

The electrical device 1100 may include an audio input device 1124 (or corresponding interface circuitry, as discussed above). The audio input device 1124 may include any device that generates a signal representative of a sound, such as microphones, microphone arrays, or digital instruments (e.g., instruments having a musical instrument digital interface (MIDI) output).

The electrical device 1100 may include a GPS device 1118 (or corresponding interface circuitry, as discussed above). The GPS device 1118 may be in communication with a satellite-based system and may receive a location of the electrical device 1100, as known in the art.

The electrical device 1100 may include another output device 1110 (or corresponding interface circuitry, as discussed above). Examples of the other output device 1110 may include an audio codec, a video codec, a printer, a wired or wireless transmitter for providing information to other devices, or an additional storage device.

The electrical device 1100 may include another input device 1120 (or corresponding interface circuitry, as discussed above). Examples of the other input device 1120 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1100 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1100 may be any other electronic device that processes data.

SELECT EXAMPLES

Example 1 provides an architecture for a class D modulator including a digital input line for receiving a digital input signal, wherein the digital input line is split into first and second parallel lines, a digital-to-analog converter coupled to the first parallel line, configured to receive the digital input signal and convert the digital input signal to an analog input signal, an analog summer configured to subtract an analog feedback signal from the analog input signal and generate an analog summer output, a loop filter configured to receive the analog summer output and produce a filtered analog output, a quantizer configured to quantize the filtered analog output and output a quantized signal, a filter coupled to the second parallel line configured to filter the digital input signal generating a filtered digital input signal, wherein the filtered digital input signal is fed forward, and a digital summer configured to add the filtered digital input signal to the quantized signal generating a digital modulator output signal.

Example 2 provides the architecture of example 1, further comprising an analog feedback loop from a modulator output to the analog summer.

Example 3 provides an architecture according to one or more of the preceding examples, wherein the first delay of the delay module equals a loop filter and quantizer delay.

Example 4 provides an architecture according to one or more of the preceding examples, wherein the analog summer output includes quantizer noise.

Example 5 provides an architecture according to one or more of the preceding examples, wherein the quantizer is a multi-bit quantizer.

Example 6 provides an architecture according to one or more of the preceding examples, wherein the digital-to-analog converter is a sigma-delta DAC.

Example 7 provides an architecture according to one or more of the preceding examples, wherein the loop filter includes a plurality of integrators arranged in series, and wherein an output from each integrator is fed forward to a third summer.

Example 8 provides an architecture according to one or more of the preceding examples, wherein the analog summer is a passive summer.

Example 9 provides an architecture for a class D modulator, including a digital input line for receiving a digital input signal, wherein the digital input line is split into first and second parallel lines, a first digital-to-analog converter (DAC) coupled to the first parallel line, configured to receive the digital input signal and convert the digital input signal to an analog input signal, a first analog summer configured to subtract an analog feedback signal from the analog input signal and generate a first analog summer output, a loop filter configured to receive the first analog summer output and produce a filtered analog output, a signal processing module coupled to the second parallel line configured to receive the digital input signal and a quantized signal and generate a processed signal, a second digital-to-analog converter (DAC) configured to convert the processed signal to an analog processed signal, a second analog summer configured to add the analog processed signal to the filtered analog output, and a quantizer configured to quantize a second summer output and generate the quantized signal.

Example 10 provides an architecture according to one or more of the preceding examples, wherein the analog feedback signal is a modulator output signal.

Example 11 provides an architecture according to one or more of the preceding examples, wherein the first DAC is a sigma-delta DAC and the second DAC is a multi-bit DAC.

Example 12 provides an architecture according to one or more of the preceding examples, wherein the signal processing module adds a first delay to the digital input signal.

Example 13 provides an architecture according to one or more of the preceding examples, wherein the second analog summer is a passive summer.

Example 14 provides an architecture according to one or more of the preceding examples, wherein the loop filter is a differential loop filter.

Example 15 provides an architecture according to one or more of the preceding examples, wherein the loop filter is a single-ended loop filter.

Example 16 provides an architecture according to one or more of the preceding examples, wherein the second DAC is one of a resistive DAC, a capacitive DAC, and a DAC having current steering elements.

Example 16 provides an architecture according to one or more of the preceding examples, wherein the signal processing module further receives a loop filter state signal.

Example 17 provides a method for an analog class D modulator, including receiving a digital input signal at a digital input including first and second parallel lines, in the first parallel line converting the digital input signal to an analog input signal at a first digital-to-analog converter (DAC), filtering the analog input signal at a loop filter to generate a filtered signal, and quantizing the filtered signal to generate a quantized signal; in the second parallel line: adding a delay to the digital input signal to generate a delayed digital input signal; and adding the delayed digital input signal to the quantized signal to generate a digital modulator output signal.

Example 18 provides a method, architecture, or apparatus according to one or more of the preceding examples, wherein the filter is a delay module, and wherein filtering the digital input signal includes adding a delay to the digital input signal.

Example 19 includes an apparatus that includes a class D modulator as discussed or depicted in any of the preceding examples, some other example, or as otherwise discussed or depicted herein.

Example 20 includes an apparatus comprising means to implement a class D modulator as discussed or depicted in any of the preceding examples, some other example, or as otherwise discussed or depicted herein.

Example 21 includes a method for implementing or manufacturing a class D modulator as discussed or depicted in any of the preceding examples, some other example, or as otherwise discussed or depicted herein.

Example 22 includes one or more non-transitory computer-readable media comprising instructions that, upon execution of the instructions by an electronic device, are to cause the electronic device to implement or manufacture a class D modulator as discussed or depicted in any of the preceding examples, some other example, or as otherwise discussed or depicted herein.

In the preceding discussion, reference may be made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the preceding detailed description is not to be taken in a limiting sense.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein.

Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The foregoing outlines features of one or more embodiments of the subject matter disclosed herein. These embodiments are provided to enable a person having ordinary skill in the art (PHOSITA) to better understand various aspects of the present disclosure. Certain well-understood terms, as well as underlying technologies and/or standards may be referenced without being described in detail. It is anticipated that the PHOSITA will possess or have access to background knowledge or information in those technologies and standards sufficient to practice the teachings of the present disclosure.

The PHOSITA will appreciate that they may readily use the present disclosure as a basis for designing or modifying other processes, structures, or variations for carrying out the same purposes and/or achieving the same advantages of the embodiments introduced herein. The PHOSITA will also recognize that such equivalent constructions do not depart from the spirit and scope of the present disclosure, and that they may make various changes, substitutions, and alterations herein without departing from the spirit and scope of the present disclosure.

The above-described embodiments may be implemented in any of numerous ways. One or more aspects and embodiments of the present application involving the performance of processes or methods may utilize program instructions executable by a device (e.g., a computer, a processor, or other device) to perform, or control performance of, the processes or methods.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above.

The computer readable medium or media may be transportable, such that the program or programs stored thereon may be loaded onto one or more different computers or other processors to implement various ones of the aspects described above. In some embodiments, computer readable media may be non-transitory media.

Note that the activities discussed above with reference to the FIGURES which are applicable to any integrated circuit that involves signal processing (for example, gesture signal processing, video signal processing, audio signal processing, analog-to-digital conversion, digital-to-analog conversion), particularly those that can execute specialized software programs or algorithms, some of which may be associated with processing digitized real-time data.

In some cases, the teachings of the present disclosure may be encoded into one or more tangible, non-transitory computer-readable mediums having stored thereon executable instructions that, when executed, instruct a programmable device (such as a processor or DSP) to perform the methods or functions disclosed herein. In cases where the teachings herein are embodied at least partly in a hardware device (such as an ASIC, IP block, or SoC), a non-transitory medium could include a hardware device hardware-programmed with logic to perform the methods or functions disclosed herein. The teachings could also be practiced in the form of Register Transfer Level (RTL) or other hardware description language such as VHDL or Verilog, which can be used to program a fabrication process to produce the hardware elements disclosed.

In example implementations, at least some portions of the processing activities outlined herein may also be implemented in software. In some embodiments, one or more of these features may be implemented in hardware provided external to the elements of the disclosed figures, or consolidated in any appropriate manner to achieve the intended functionality. The various components may include software (or reciprocating software) that can coordinate in order to achieve the operations as outlined herein. In still other embodiments, these elements may include any suitable algorithms, hardware, software, components, modules, interfaces, or objects that facilitate the operations thereof.

Any suitably-configured processor component can execute any type of instructions associated with the data to achieve the operations detailed herein. Any processor disclosed herein could transform an element or an article (for example, data) from one state or thing to another state or thing. In another example, some activities outlined herein may be implemented with fixed logic or programmable logic (for example, software and/or computer instructions executed by a processor) and the elements identified herein could be some type of a programmable processor, programmable digital logic (for example, an FPGA, an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof.

In operation, processors may store information in any suitable type of non-transitory storage medium (for example, random access memory (RAM), read only memory (ROM), FPGA, EPROM, electrically erasable programmable ROM (EEPROM), etc.), software, hardware, or in any other suitable component, device, element, or object where appropriate and based on particular needs. Further, the information being tracked, sent, received, or stored in a processor could be provided in any database, register, table, cache, queue, control list, or storage structure, based on particular needs and implementations, all of which could be referenced in any suitable timeframe.

Any of the memory items discussed herein should be construed as being encompassed within the broad term 'memory.' Similarly, any of the potential processing elements, modules, and machines described herein should be construed as being encompassed within the broad term 'microprocessor' or 'processor.' Furthermore, in various embodiments, the processors, memories, network cards, buses, storage devices, related peripherals, and other hardware elements described herein may be realized by a processor, memory, and other related devices configured by software or firmware to emulate or virtualize the functions of those hardware elements.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a personal digital assistant (PDA), a smart phone, a mobile phone, an iPad, or any other suitable portable or fixed electronic device.

Also, a computer may have one or more input and output devices. These devices can be used, among other things, to present a user interface. Examples of output devices that may be used to provide a user interface include printers or display screens for visual presentation of output and speakers or other sound generating devices for audible presentation of output. Examples of input devices that may be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks or wired networks.

Computer-executable instructions may be in many forms, such as program modules, executed by one or more computers or other devices. Generally, program modules include routines, programs, objects, components, data structures, etc. that performs particular tasks or implement particular abstract data types. Typically, the functionality of the program modules may be combined or distributed as desired in various embodiments.

The terms "program" or "software" are used herein in a generic sense to refer to any type of computer code or set of computer-executable instructions that may be employed to program a computer or other processor to implement various aspects as described above. Additionally, it should be appreciated that according to one aspect, one or more computer programs that when executed perform methods of the present application need not reside on a single computer or processor, but may be distributed in a modular fashion among a number of different computers or processors to implement various aspects of the present application.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code may be executed on any suitable processor or collection of processors, whether provided in a single computer or distributed among multiple computers.

Computer program logic implementing all or part of the functionality described herein is embodied in various forms, including, but in no way limited to, a source code form, a computer executable form, a hardware description form, and various intermediate forms (for example, mask works, or forms generated by an assembler, compiler, linker, or locator). In an example, source code includes a series of computer program instructions implemented in various programming languages, such as an object code, an assembly language, or a high-level language such as OpenCL, RTL, Verilog, VHDL, Fortran, C, C++, JAVA, or HTML for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

In some embodiments, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc.

Other components such as external storage, additional sensors, controllers for audio/video display, and peripheral devices may be attached to the board as plug-in cards, via cables, or integrated into the board itself. In another example embodiment, the electrical circuits of the FIGURES may be implemented as standalone modules (e.g., a device with associated components and circuitry configured to perform a specific application or function) or implemented as plug-in modules into application-specific hardware of electronic devices.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this disclosure.

In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Interpretation of Terms

All definitions, as defined and used herein, should be understood to control over dictionary definitions, definitions in documents incorporated by reference, and/or ordinary meanings of the defined terms. Unless the context clearly requires otherwise, throughout the description and the claims:

"comprise," "comprising," and the like are to be construed in an inclusive sense, as opposed to an exclusive or exhaustive sense; that is to say, in the sense of "including, but not limited to".

"connected," "coupled," or any variant thereof, means any connection or coupling, either direct or indirect, between two or more elements; the coupling or connection between the elements can be physical, logical, or a combination thereof.

"herein," "above," "below," and words of similar import, when used to describe this specification shall refer to this specification as a whole and not to any particular portions of this specification.

"or," in reference to a list of two or more items, covers all of the following interpretations of the word: any of the items in the list, all of the items in the list, and any combination of the items in the list.

the singular forms "a", "an" and "the" also include the meaning of any appropriate plural forms.

Words that indicate directions such as "vertical", "transverse", "horizontal", "upward", "downward", "forward", "backward", "inward", "outward", "vertical", "transverse", "left", "right", "front", "back", "top", "bottom", "below", "above", "under", and the like, used in this description and any accompanying claims (where present) depend on the specific orientation of the apparatus described and illustrated. The subject matter described herein may assume various alternative orientations. Accordingly, these directional terms are not strictly defined and should not be interpreted narrowly.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined.

Elements other than those specifically identified by the "and/or" clause may optionally be present, whether related or unrelated to those elements specifically identified. Thus, as a non-limiting example, a reference to "A and/or B", when used in conjunction with open-ended language such as "comprising" may refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As used herein, the term "between" is to be inclusive unless indicated otherwise. For example, "between A and B" includes A and B unless indicated otherwise.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke 35 U.S.C. § 112(f) as it exists on the date of the filing hereof unless the words "means for" or "steps for" are specifically used in the particular claims; and (b) does not intend, by any statement in the disclosure, to limit this disclosure in any way that is not otherwise reflected in the appended claims.

The present invention should therefore not be considered limited to the particular embodiments described above. Various modifications, equivalent processes, as well as numerous structures to which the present invention may be applicable, will be readily apparent to those skilled in the art to which the present invention is directed upon review of the present disclosure.

What is claimed is:

1. An architecture for a class D modulator, comprising:
a digital input line configured to receive a digital input signal, wherein the digital input line is split into a first parallel line and a second parallel line;
a digital-to-analog converter coupled to the first parallel line, the digital-to-analog converter configured to receive the digital input signal and convert the digital input signal to an analog input signal;
an analog summer configured to subtract an analog feedback signal from the analog input signal and generate an analog summer output;
a loop filter configured to receive the analog summer output and produce a filtered analog output;
a quantizer configured to quantize the filtered analog output and output a quantized signal;
a filter module coupled to the second parallel line configured to digitally filter the digital input signal generating a filtered digital input signal, wherein the filtered digital input signal is fed forward; and
a digital summer configured to add the filtered digital input signal to the quantized signal generating a digital modulator output signal.

2. The architecture of claim 1, further comprising an analog feedback loop from a modulator output to the analog summer.

3. The architecture of claim 1, wherein the filter module is a delay module configured to add a first delay to the digital input signal, and wherein the first delay of the delay module equals a loop filter and quantizer delay.

4. The architecture of claim 1, wherein the analog summer output includes quantizer noise.

5. The architecture of claim 1, wherein the quantizer is a multi-bit quantizer.

6. The architecture of claim 1, wherein the digital-to-analog converter is a sigma-delta DAC.

7. The architecture of claim 1, wherein the loop filter includes a plurality of integrators arranged in series, and wherein an output from each integrator of the plurality of integrators is fed forward to a third summer.

8. The architecture of claim 1, wherein the analog summer is a passive summer.

9. An architecture for a class D modulator, comprising:
a digital input line configured to receive a digital input signal, wherein the digital input line is split into a first parallel line and a second parallel line;
a first digital-to-analog converter (DAC) coupled to the first parallel line, the first DAC configured to receive the digital input signal and convert the digital input signal to an analog input signal;
a first analog summer configured to subtract an analog feedback signal from the analog input signal and generate a first analog summer output;
a loop filter configured to receive the first analog summer output and produce a filtered analog output;
a signal processing module coupled to the second parallel line, the signal processing module configured to receive the digital input signal and a quantized signal and generate a processed signal;
a second digital-to-analog converter (DAC) configured to convert the processed signal to an analog processed signal;
a second analog summer configured to add the analog processed signal to the filtered analog output; and
a quantizer configured to quantize a second summer output and generate the quantized signal.

10. The architecture of claim 9, wherein the analog feedback signal is a modulator output signal.

11. The architecture of claim 9, wherein the first DAC is a sigma-delta DAC and the second DAC is one of a multi-bit DAC and a single-bit DAC.

12. The architecture of claim 9, wherein the signal processing module adds a first delay to the digital input signal.

13. The architecture of claim 9, wherein the second analog summer is a passive summer.

14. The architecture of claim 9, wherein the loop filter is a differential loop filter.

15. The architecture of claim 9, wherein the loop filter is a single-ended loop filter.

16. The architecture of claim 9, wherein the second DAC is one of a resistive DAC, a capacitive DAC, and a DAC having current steering elements.

17. The architecture of claim 9, wherein the signal processing module further receives a loop filter state signal.

18. A method for an analog class D modulator, comprising:
receiving a digital input signal at a digital input including a first parallel line and a second parallel line;
in the first parallel line:
converting the digital input signal to an analog input signal at a first digital-to-analog converter (DAC);
filtering the analog input signal at a loop filter to generate a filtered signal; and
quantizing the filtered signal to generate a quantized signal;
in the second parallel line:
filtering the digital input signal to generate a filtered digital input signal; and
adding the filtered digital input signal to the quantized signal to generate a digital modulator output signal.

19. The method of claim 18, further comprising adding the digital modulator output signal to the analog input signal to generate a summed analog input signal, and wherein filtering the analog input signal comprises filtering the summed analog input signal.

20. The method of claim 19, wherein filtering the digital input signal includes adding a delay to the digital input signal.

* * * * *